United States Patent
Kubota et al.

(10) Patent No.: US 10,644,672 B2
(45) Date of Patent: May 5, 2020

(54) CRYSTAL UNIT AND METHOD OF ADJUSTING CRYSTAL UNIT

(71) Applicant: FUJITSU LIMITED, Kawasaki-shi, Kanagawa (JP)

(72) Inventors: Hajime Kubota, Kawasaki (JP); Masayuki Itoh, Kawasaki (JP); Masakazu Kishi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 602 days.

(21) Appl. No.: 15/265,906

(22) Filed: Sep. 15, 2016

(65) Prior Publication Data

US 2017/0099039 A1 Apr. 6, 2017

(30) Foreign Application Priority Data

Oct. 6, 2015 (JP) .................................. 2015-198886

(51) Int. Cl.
*H03H 9/17* (2006.01)
*H03H 3/02* (2006.01)
*H03H 9/13* (2006.01)

(52) U.S. Cl.
CPC ............... *H03H 9/17* (2013.01); *H03H 3/02* (2013.01); *H03H 9/13* (2013.01)

(58) Field of Classification Search
CPC .................... H03H 9/17; H03H 3/02
See application file for complete search history.

(56) References Cited

U.S. PATENT DOCUMENTS

| 4,572,525 | A | * | 2/1986 | Feldmeier | ............... B23B 31/12 279/131 |
| 4,574,255 | A | * | 3/1986 | Fujii | ..................... C04B 35/497 257/E23.009 |
| 5,910,755 | A | | 6/1999 | Mishiro et al. | |
| 10,090,110 | B2 | * | 10/2018 | Kubota | ..................... H01G 4/30 |
| 2001/0026865 | A1 | | 10/2001 | Miyoshi | |
| 2002/0163787 | A1 | | 11/2002 | Kameda et al. | |
| 2009/0154121 | A1 | | 6/2009 | Lee | |

(Continued)

FOREIGN PATENT DOCUMENTS

JP 4-211505 A 8/1992
JP 7-161575 A 6/1995

(Continued)

OTHER PUBLICATIONS

Japanese Office Action dated Mar. 12, 2019 for corresponding Japanese Patent Application No. 2015-198886, with English Translation, 12 pages.

(Continued)

*Primary Examiner* — Thomas M Dougherty
*Assistant Examiner* — Karen B Addison
(74) *Attorney, Agent, or Firm* — Fujitsu Patent Center

(57) ABSTRACT

A crystal unit includes: a capacitor body in which a plurality of light-transmitting dielectrics and a plurality of internal electrodes are alternately stacked; a crystal piece arranged above the capacitor body and having excitation electrodes on both surfaces thereof; an external electrode formed on a surface of the capacitor body; and a first conductor portion formed in an inner layer of the capacitor body, and including one end electrically coupled to a first internal electrode among the plurality of internal electrodes, and the other end electrically coupled to the external electrode.

14 Claims, 15 Drawing Sheets

(56) References Cited

U.S. PATENT DOCUMENTS

| | | |
|---|---|---|
| 2014/0133064 A1 | 5/2014 | Ahn et al. |
| 2015/0213958 A1 | 7/2015 | Nakashima et al. |
| 2017/0099039 A1* | 4/2017 | Kubota ................ H03H 9/0547 |

FOREIGN PATENT DOCUMENTS

| | | |
|---|---|---|
| JP | 9-298439 | 11/1997 |
| JP | 10-303061 A | 11/1998 |
| JP | 2002-330044 A | 11/2002 |
| JP | 2003-158440 | 5/2003 |
| JP | 2004-282621 A | 10/2004 |
| JP | 2015-138933 A | 7/2015 |
| WO | 94/22281 | 9/1994 |

OTHER PUBLICATIONS

U.S. Office Notice of Allowance dated Jul. 31, 2018 for copending U.S. Appl. No. 15/281,193, 9 pages.

U.S. Office Action dated Mar. 19, 2018 for co-pending U.S. Appl. No. 15/281,193, 14 pages.

Japanese Office Action dated Aug. 27, 2019 for corresponding Japanese Patent Application No. 2015-198887, with English Translation, 9 pages.

Japanese Office Action dated Apr. 9, 2019 for corresponding Japanese Patent Application No. 2015-198887 with, English Translation, 14 pages.

Japanese Office Action dated Feb. 18, 2020 for corresponding Japanese Patent Application No. 2015-198887 with English Translation, 7 pages.

* cited by examiner

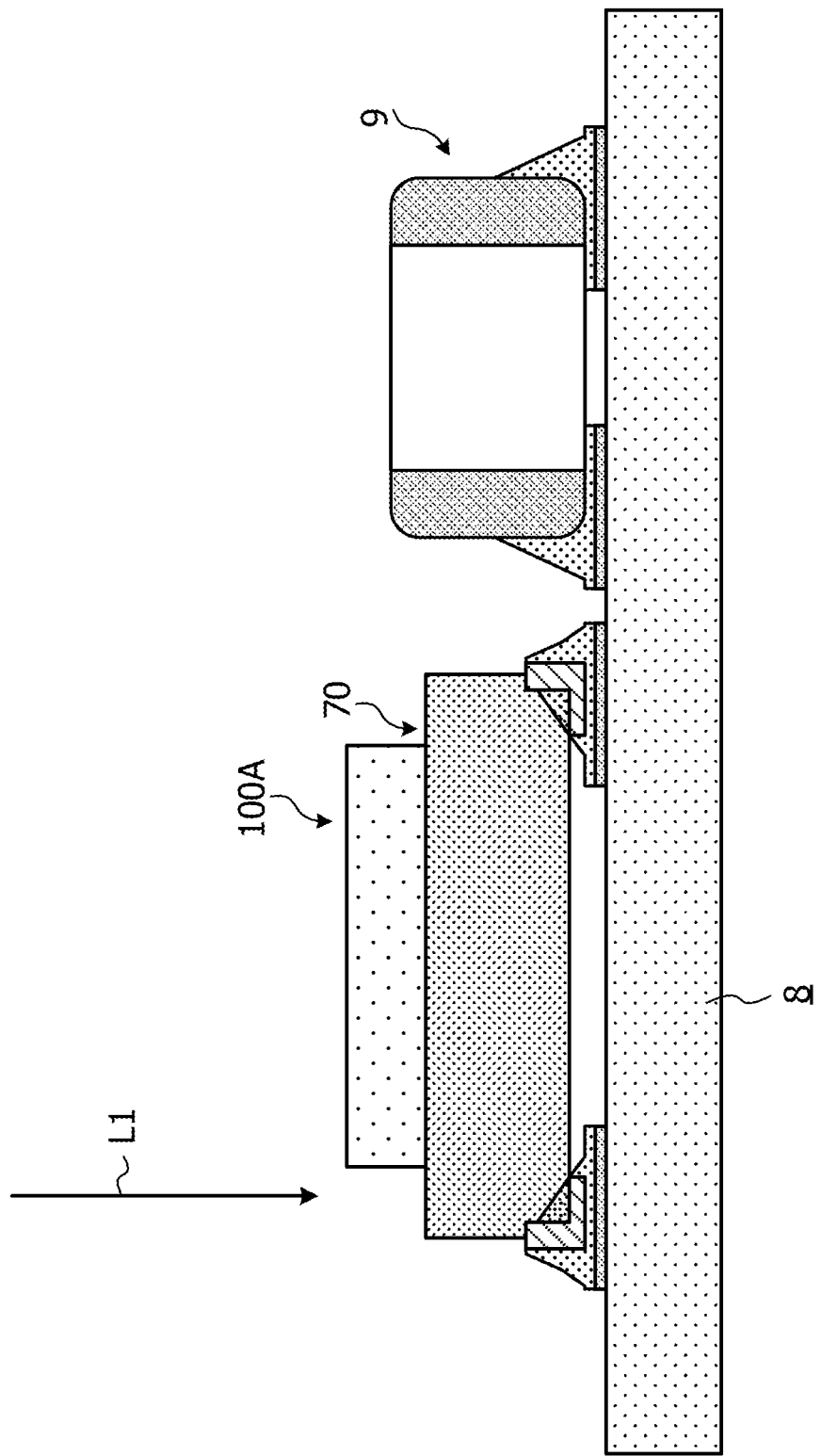

CRYSTAL UNIT AND METHOD OF ADJUSTING CRYSTAL UNIT

CROSS-REFERENCE TO RELATED APPLICATIONS

This application is based upon and claims the benefit of priority of the prior Japanese Patent Application No. 2015-198886 filed on Oct. 6, 2015, the entire contents of which are incorporated herein by reference.

FIELD

The embodiments discussed herein are related to a crystal unit, and a method of adjusting the crystal unit.

BACKGROUND

There is known a technology of finely adjusting an oscillation frequency of a surface mounting type piezoelectric component by reducing a part of an input electrode pattern, an earth electrode pattern, or an output electrode pattern through laser trimming during the manufacturing process of the piezoelectric component.

In the related art, a capacitance may be adjusted by cutting a part of an output electrode pattern at the time of manufacturing the piezoelectric component, but may not be adjusted after the piezoelectric component is mounted on a board. When the piezoelectric component is mounted on the board and electrically coupled to an integrated circuit (IC), a vibration characteristic is varied under the influence of the capacitance of the pattern or the like on the board. Thus, it is difficult to obtain a desired vibration characteristic even when the capacitance is adjusted during the manufacturing.

The following is a reference document.
[Document 1] Japanese Laid-Open Patent Publication No. 09-298439.

SUMMARY

According to an aspect of the invention, a crystal unit includes: a capacitor body in which a plurality of light-transmitting dielectrics and a plurality of internal electrodes are alternately stacked; a crystal piece arranged above the capacitor body and having excitation electrodes on both surfaces thereof; an external electrode formed on a surface of the capacitor body; and a first conductor portion formed in an inner layer of the capacitor body, and including one end electrically coupled to a first internal electrode among the plurality of internal electrodes, and the other end electrically coupled to the external electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7A is an explanatory view of a capacitance adjusting method of a crystal unit;

DESCRIPTION OF EMBODIMENTS

Hereinafter, detailed descriptions will be made on respective embodiments with reference to accompanying drawings.

In the following description, unless otherwise specified, the terms "connection" and "disconnection" refer to "electrical connection" and "electrical disconnection," respectively. In the following description, the term "internal electrode" represents a conductor region formed in the inner layer of a capacitor body, that is, a conductor region that may function as a capacitor. That is, such a conductor region may not function as a capacitor as described below after the capacitance is adjusted. However, in this case as well, the conductor region is an "internal electrode."

Figure 1:
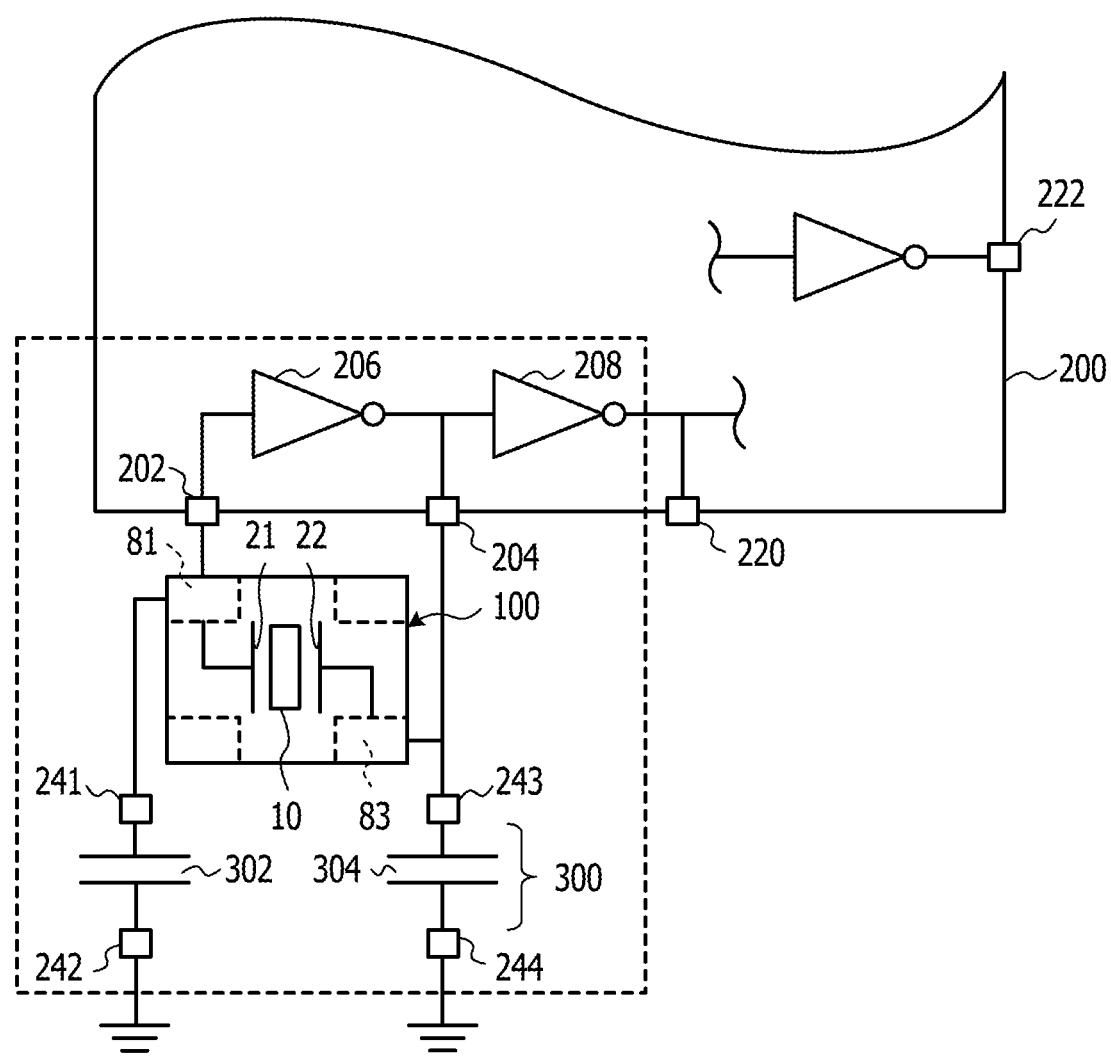
FIG. 1 is a diagram schematically illustrating an example of a circuit configuration incorporating a crystal unit.

FIG. 1 is a diagram schematically illustrating an example of a circuit configuration incorporating a crystal unit 100.

In the example illustrated in FIG. 1, the crystal unit 100 is connected to an IC 200. That is, electrodes 81 and 83 of the crystal unit 100 are connected to an input terminal 202 and an output terminal 204 of the IC 200, respectively. The crystal unit 100 generates a clock to be used in the IC 200. The IC 200 includes an inverting amplifier 206 and an output buffer 208. The signal input to the input terminal 202 from an upper excitation electrode 21 via the electrode 81 is inversely amplified by the inverting amplifier 206. The inversely amplified signal is input to the output buffer 208, and is supplied to a lower excitation electrode 22 via the electrode 83. In the example illustrated in FIG. 1, the arrangement of the upper excitation electrode 21 and the lower excitation electrode 22 may be reversed.

A matching capacitor 300 is connected to the crystal unit 100. Specifically, a first capacitor 302 is connected between the ground and the electrode 81 of the crystal unit 100, and a second capacitor 304 is connected between the ground and the electrode 83 of the crystal unit 100. Here, the first capacitor 302 is connected to the electrode 81 through a first electrode 241 and is connected to the ground through a second electrode 242. Similarly, the second capacitor 304 is connected to the electrode 83 through a third electrode 243 and is connected to the ground through a fourth electrode 244. In FIG. 1, with respect to the IC 200, a capacitance inside the terminal, a stray capacitance of a wiring pattern of a mounting board, a resistance that limits the current flowing through the crystal unit 100 and the like are not illustrated. The matching capacitor 300 is provided to perform adjustment (matching adjustment) so that the oscillation frequency of the crystal unit 100 becomes a desired value (a design value) when the total capacity (the load capacity value) of all of the crystal unit 100 and the circuit of the IC 200 is set as a load. In FIG. 1, the area surrounded by dotted lines forms an oscillation circuit.

Hereinafter, descriptions will be made on several embodiments of a crystal unit applicable as the crystal unit 100 illustrated in FIG. 1.

First Embodiment

Figure 2A:
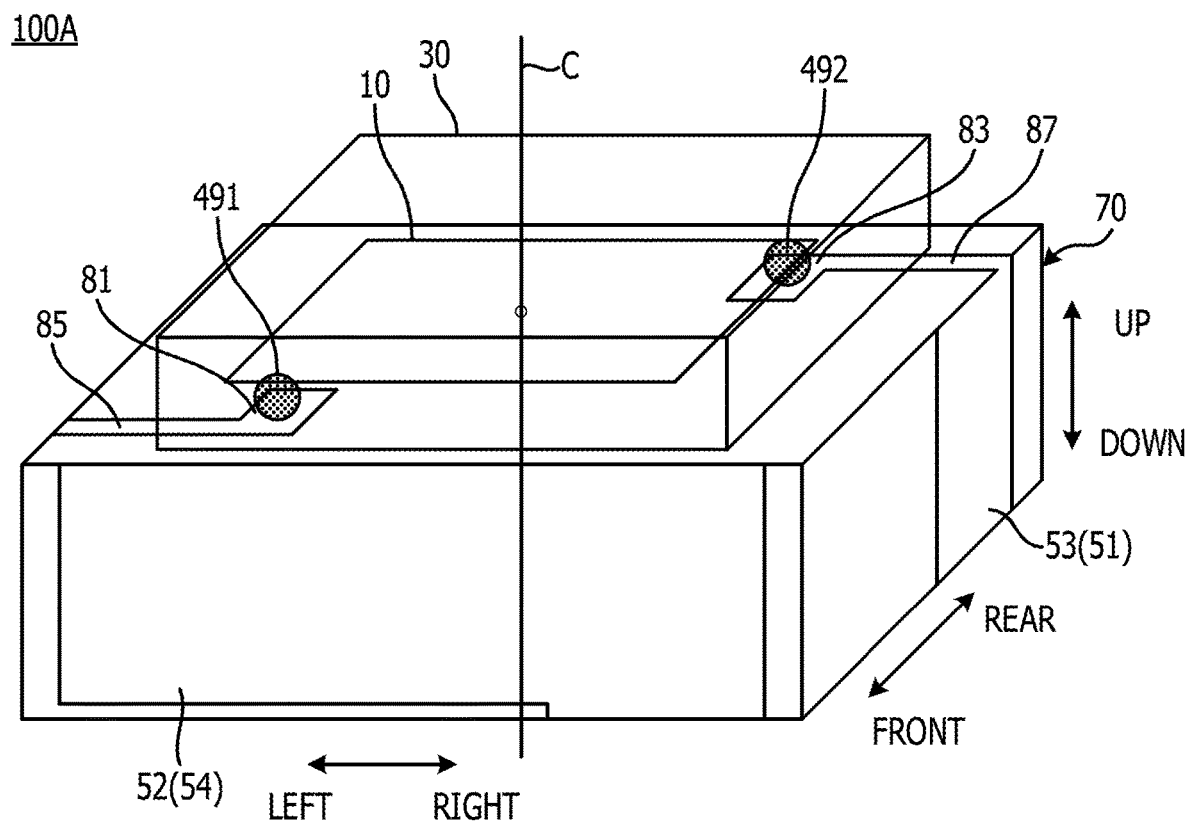
FIG. 2A is a perspective view schematically illustrating an external appearance of the crystal unit according to a first embodiment.
Figure 2B:
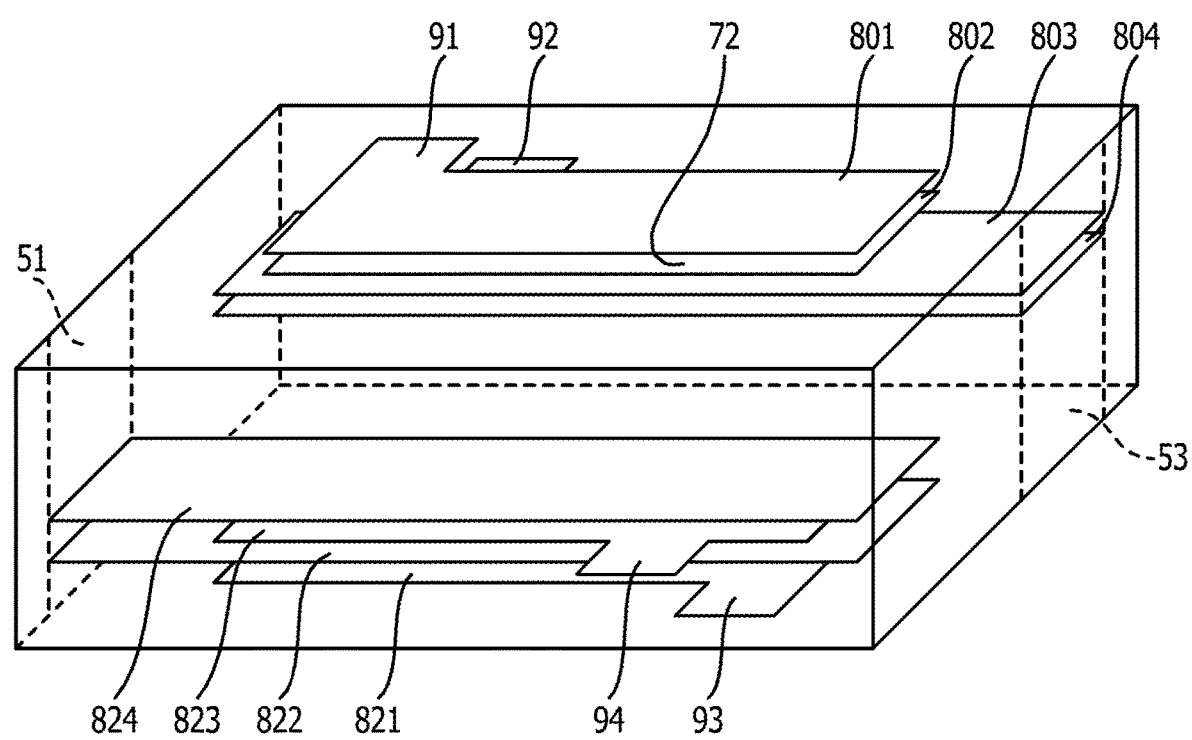
FIG. 2B is a perspective view schematically illustrating an internal electrode structure or the like of a capacitor body of the crystal unit illustrated in FIG. 2A.
Figure 2C:
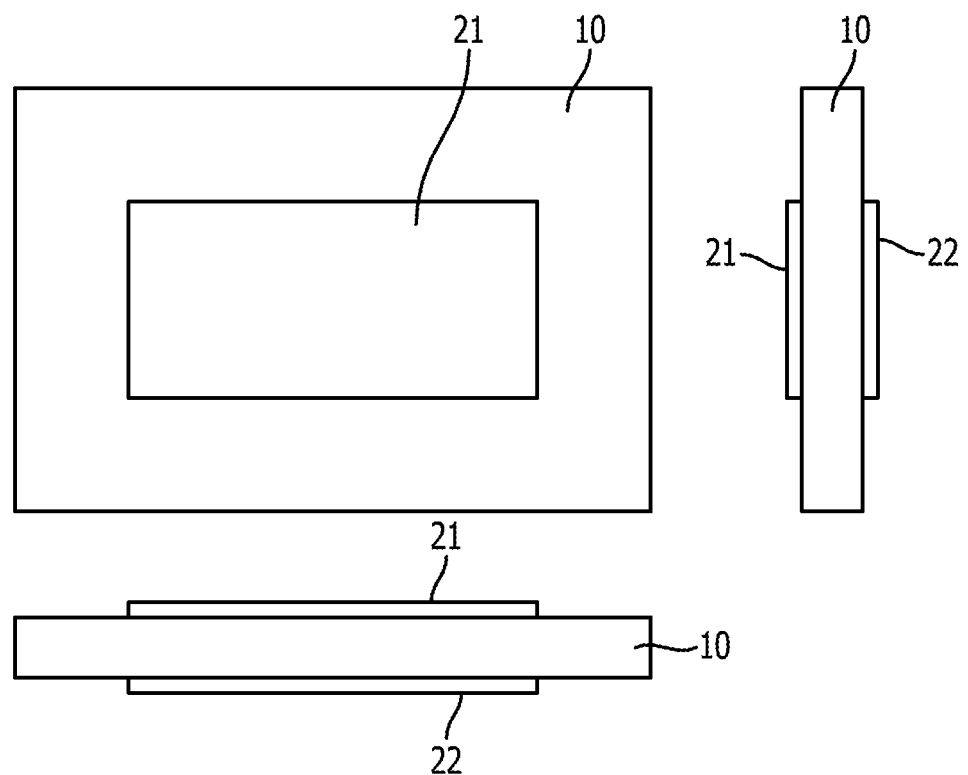
FIG. 2C is a schematic 3-sided view of a crystal piece.

FIG. 2A is a perspective view schematically illustrating an external appearance of a crystal unit 100A according to a first embodiment, and FIG. 2B is a perspective view schematically illustrating an internal electrode structure or the like of a capacitor body 70 of the crystal unit 100A illustrated in FIG. 2A. FIG. 2C is a schematic 3-sided view of a crystal piece 10. In FIG. 2A, the configuration within a casing 30 (e.g., a crystal piece 10 or the like) is illustrated in perspective view. In FIG. 2A, a geometrical center C of the crystal unit 100A is illustrated. In FIG. 2B, the internal electrode structure or the like of the crystal unit 100A is illustrated in perspective view. In FIG. 2B, the illustration of cavities 41 to 46 to be described below is omitted. In FIG. 2C, an upper excitation electrode 21 and a lower excitation electrode 22 together with the crystal piece 10 are illustrated.

Figure 3:
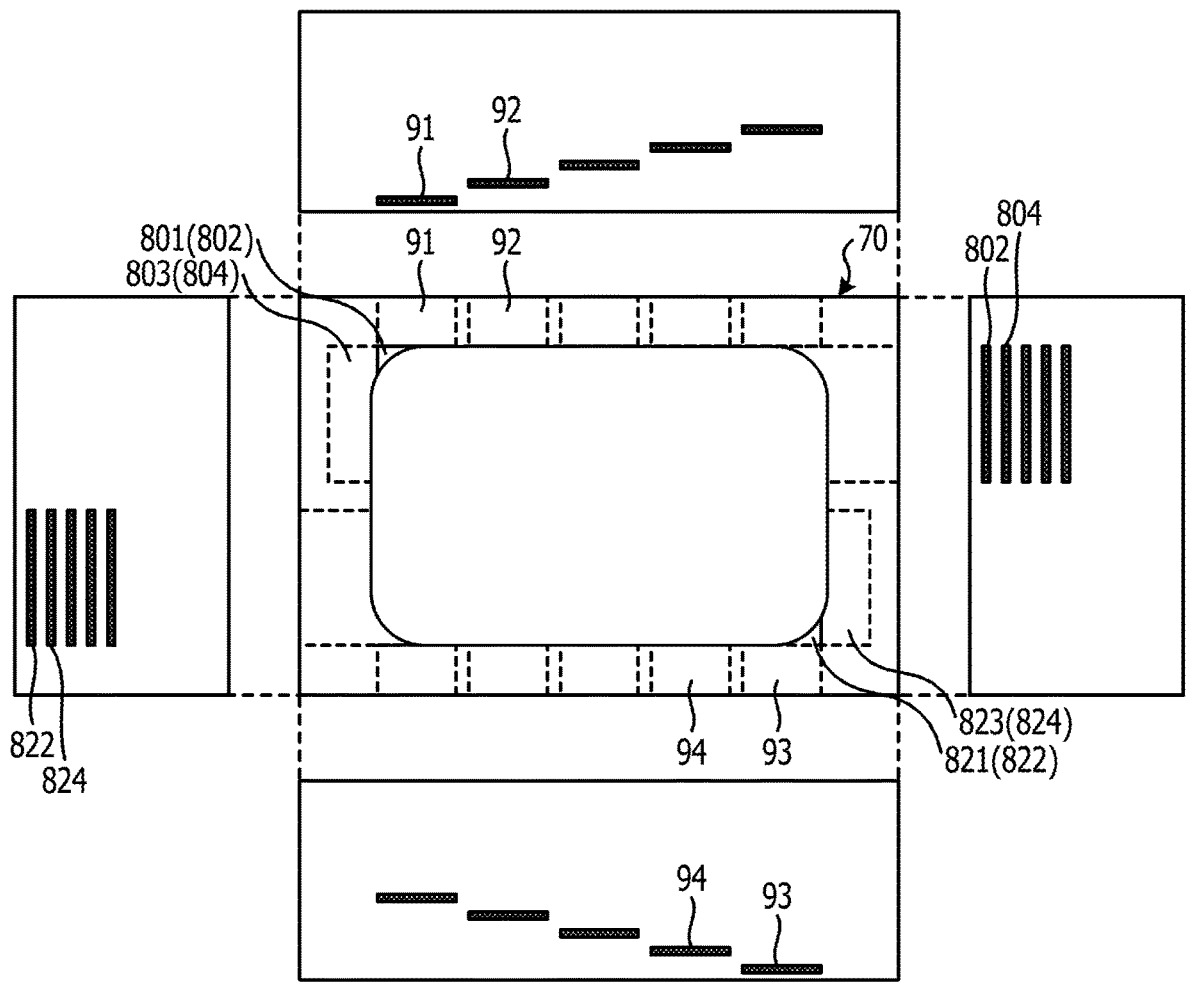
FIG. 3 is a 5-sided view illustrating an external appearance of a crystal unit (an external appearance of an internal electrode structure)
Figure 4:
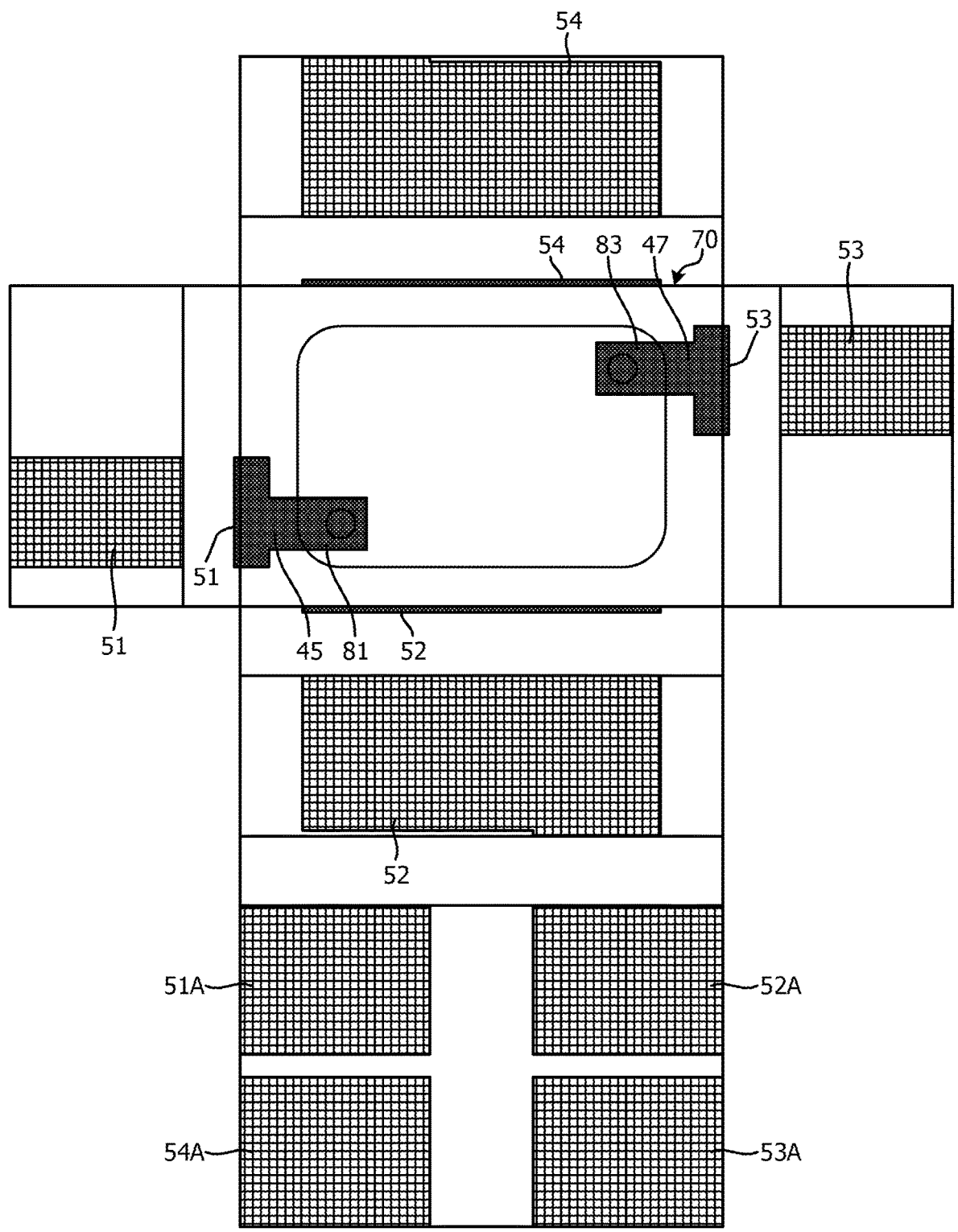
FIG. 4 is a 6-sided view illustrating an external appearance of a crystal unit (an external appearance of an external electrode structure)

FIG. 3 is a 5-sided view illustrating an external appearance of the crystal unit 100A (a 5-sided view excluding a bottom view). Meanwhile, in FIG. 3, in the top view, a part of the internal electrode structure is illustrated in perspective view. In FIG. 3, illustration of conductor patterns formed on the surface of the crystal unit 100A, such as electrodes 81 and 83 or external electrodes 51 to 54, is omitted. FIG. 4 is a 6-sided view illustrating an external appearance of the crystal unit 100A. In FIG. 4, conductor patterns formed on the surface of the crystal unit 100A, such as electrodes 81 and 83 or external electrodes 51 to 54, are illustrated. In FIG. 4, illustration of the casing 30 and its internal components (e.g., the crystal piece 10 or the like) is omitted. In FIG. 4, the shapes of the conductor patterns 85 and 87 are different from those illustrated in FIGS. 2A and 2B, but such a difference is not essential.

Here, in FIG. 2B, only a part of a plurality of internal electrodes is illustrated. That is, in FIG. 3, an internal electrode structure in which five capacitors at each of the front and rear sides may be formed is illustrated. However, in FIG. 2B, only two close to the top surface among the five capacitors at the rear side, and only two close to the bottom surface at the front side are illustrated. Hereinafter, unless otherwise stated, descriptions will be made on the part of the internal electrodes illustrated in FIG. 2B.

Hereinafter, the thickness direction of the crystal piece 10 (the vertical direction in FIG. 2A) is set as a vertical direction, and a side of the casing 30 with respect to the capacitor body 70 is set as an "upper" side. Further, the front-rear direction, and the left-right direction are the same as those illustrated in FIG. 2A. However, the direction of the mounting state of the crystal unit 100A is optional.

The crystal unit 100A includes the crystal piece 10, the casing 30, the electrodes 81 and 83, external electrodes 51 to 54, the capacitor body 70, and the conductor portions 91 to 95 (e.g., an example of a first conductor portion or a second conductor portion). In the example illustrated in FIG. 2A, the crystal unit 100A, except for the internal electrode structure, has a configuration symmetrical with respect to a point of the center C. Also, the crystal unit 100A further includes the upper excitation electrode 21 and the lower excitation electrode 22 as illustrated in FIG. 2C, but the illustration of the upper excitation electrode 21 and the lower excitation electrode 22 is omitted in FIG. 2A.

The crystal piece 10 may be, for example, an AT-cut synthetic crystal substrate. The crystal piece 10 is supported by the capacitor body 70 through conductive adhesives 491 and 492. Here, the upper excitation electrode 21 is connected to the electrode 81 through the conductive adhesive 491, and the lower excitation electrode 22 is connected to the electrode 83 through the conductive adhesive 492.

The upper excitation electrode 21 and the lower excitation electrode 22, as illustrated in FIG. 2C, are provided on the top and bottom surfaces of the crystal piece 10 to vertically face each other. In FIG. 2C, illustration of conductor patterns which connect the upper excitation electrode 21 and the lower excitation electrode 22 to conductive adhesives 491 and 492, respectively is omitted.

The casing 30 is formed of, for example, metal. The casing 30 has a configuration having an interior space in which only the lower side is opened. The casing 30 is provided on the capacitor body 70 in such a manner that the casing 30 includes the crystal piece 10 in the internal space, and the lower side opening is sealed by the top surface of the capacitor body 70. For example, the interior space of the casing 30 may be kept in a vacuum or may be filled with dry nitrogen.

The electrodes 81 and 83 are formed on the top surface of the capacitor body 70. The electrode 81 is connected to the external electrode 51 (see, e.g., FIG. 2B) via a conductor pattern 85 formed on the top surface of the capacitor body 70. In the example illustrated in FIG. 2A, the electrode 81 and the conductor pattern 85 are formed at a position close to the external electrode 51, that is, at the front left side on the top surface of the capacitor body 70. The electrode 83 is connected to the external electrode 53 (see, e.g., FIG. 2A) via a conductor pattern 87 formed on the top surface of the capacitor body 70. The electrode 83 and the conductor pattern 87 are formed at a position close to the external electrode 53, that is, at the rear right side of the top surface of the capacitor body 70. Also, the conductor pattern 85 and the conductor pattern 87 may be formed in the inner layer of the capacitor body 70.

The external electrodes 51 to 54 are provided on the surface of the capacitor body 70. The external electrodes 51 to 54 form the first electrode 241, the second electrode 242, the third electrode 243 and the fourth electrode 244 illustrated in FIG. 1, respectively.

In the example illustrated in FIG. 2A, the external electrodes 51 to 54 are formed on four side surfaces of the capacitor body 70, respectively. Specifically, the external electrode 51 is formed on the left side surface of the capacitor body 70, and the external electrode 52 is formed on the front side surface of the capacitor body 70. The external electrode 53 is formed on the right side surface of the capacitor body 70, and the external electrode 54 is formed on the rear side surface of the capacitor body 70. In FIG. 2A, the external electrodes 51 and 54 are not directly illustrated, but are formed at positions (regions) to be symmetrical with respect to the external electrodes 53 and 52, respectively, around the point of the center C as indicated in the parentheses of the external electrodes 53 and 52.

The external electrodes 51 to 54, as illustrated in FIG. 4, may include electrode portions formed on the bottom surface of the capacitor body 70. That is, the external electrodes 51 to 54, as illustrated in FIG. 4, may include electrode portions 51A to 54A, respectively, formed on the bottom surface of the capacitor body 70. The electrode portions 51A to 54A are formed to be connected with, for example, patterns on a board 8 (to be described below).

The capacitor body 70 forms the matching capacitor 300 (see, e.g., FIG. 1) of the crystal unit 100A. The capacitor body 70 has a stacked structure including a light-transmitting dielectric 72 and internal electrodes 801 to 804, and 821 to 824. The dielectric 72 includes, for example, a transparent ceramic material. The dielectric 72 is formed between the respective internal electrodes 801 to 804 and 821 to 824 in the vertical direction.

The dielectric 72 forms the surface layer of the capacitor body 70. In FIG. 2B, reference numeral "72" indicates a portion between two certain upper and lower internal electrodes 801 and 802.

In the example illustrated in FIG. 2B, a plurality of internal electrodes 801 to 804, and the portion of the dielectric 72 between the internal electrodes form the first capacitor 302. That is, the internal electrodes 801 and 802 are paired, and the internal electrodes 803 and 804 are paired so that a total of two capacitors are formed. The two capacitors are parallel to each other to form the first capacitor 302. Similarly, a plurality of internal electrodes 821 to 824, and the portion of the dielectric 72 between the internal electrodes form the first capacitor 302. That is, the internal electrodes 821 and 822 are paired, and the internal electrodes 823 and 824 are paired so that a total of two capacitors are formed. The two capacitors are parallel to each other to form the first capacitor 302. However, as described later, some of the plurality of internal electrodes (e.g., internal electrodes 801 to 804, 821, and 822) may be disconnected from the ground. In this case, a pair of internal electrodes including an internal electrode disconnected from the ground does not form the first capacitor 302 or the second capacitor 304.

In the example illustrated in FIG. 2B, the internal electrodes 801 to 804 are formed at the rear side with respect to the center C, and at the top side of the capacitor body 70. The internal electrodes 821 to 824 are formed at the front side with respect to the center C and at the bottom side of the capacitor body 70. Meanwhile, the number or arrangement of the internal electrodes is not limited thereto, but is optional.

In the example illustrated in FIG. 2B, according to a preferred embodiment, the internal electrodes 803 and 804 extend leftwards beyond the left ends of the internal electrodes 801 and 802 in the left-right direction. Accordingly, the left end portions of the internal electrodes 803 and 804, as illustrated in FIG. 3, may be transparently seen in the top view of the capacitor body 70. The internal electrodes 823 and 824 extend rightwards beyond the right ends of the internal electrodes 821 and 822 in the left-right direction. Accordingly, the right end portions of the internal electrodes 823 and 824 may be transparently seen in the top view of the capacitor body 70. This technical significance will be described below.

The conductor portions 91 to 94 are formed in the inner layer of the capacitor body 70. The conductor portions 91 to 94 may be seen transparently from the outside. That is, the conductor portions 91 to 94 are formed at positions where the conductor portions 91 to 94 are seen transparently when the capacitor body 70 is viewed from the outside. In the example illustrated in FIG. 2B, the internal electrodes 801 to 804 are the same in the front-rear width, and arranged at the same position in the front-rear direction, and the conductor portions 91 and 92 are formed at the rear side of the internal electrodes 801 to 804 (e.g., at transparently seen positions) in the top view. Similarly, the internal electrodes 821 to 824 are the same in the front-rear width, and arranged at the same position in the front-rear direction, and the conductor portions 93 and 94 are formed at the front side of the internal electrodes 821 to 824 (e.g., at transparently seen positions) in the top view. This technical significance will be described below.

One end of the conductor portion 91 (e.g., a front end portion in the front-rear direction) is connected to the internal electrode 801 (e.g., an example of a first or second internal electrode) in the inner layer of the capacitor body 70, and the other end (e.g., a rear end portion in the front-rear direction) is exposed on the rear side surface of the capacitor body 70 (see, e.g., FIG. 3) to be connected to the external electrode 54. The conductor portion 91 is formed to protrude rearwards from the rear edge of the internal electrode 801. The conductor portion 91 is provided on only a part of the internal electrode 801 in the left-right direction, and is smaller than the internal electrode 801 in the width (the left-right width). That is, the conductor portion 91 has a smaller width than a minimum width of the internal electrode 801. The conductor portion 91 may be formed to be integrated with the internal electrode 801.

One end of the conductor portion 92 (e.g., a front end portion in the front-rear direction) is connected to the internal electrode 803 (e.g., an example of a first or second internal electrode) in the inner layer of the capacitor body 70, and the other end (e.g., a rear end portion in the front-rear direction) is exposed on the rear side surface of the capacitor body 70 (see, e.g., FIG. 3) to be connected to the external electrode 54. The conductor portion 92 is formed to protrude rearwards from the rear edge of the internal electrode 803. The conductor portion 92 is provided on only a part of the internal electrode 803 in the left-right direction, and is smaller than the internal electrode 803 in the width (the left-right width). That is, the conductor portion 92 has a smaller width than a minimum width of the internal electrode 803. The conductor portion 92 is formed at a position which is offset with respect to the conductor portion 91. In the example illustrated in FIG. 2B, the conductor portion 92 is formed to be offset with respect to the conductor portion 91 in the left-right direction, specifically rightwards from the conductor portion 91. The conductor portion 92 may be formed to be integrated with the internal electrode 803.

In this manner, among the internal electrodes 801 to 804, the internal electrodes 801 and 803 are connected to the external electrode 54 through the conductor portions 91 and 92, respectively. Meanwhile, among the internal electrodes 801 to 804, the right end portion of each of the internal electrodes 802 and 804 is exposed on the right side surface of the capacitor body 70 (see, e.g., FIG. 3) to be connected to the external electrode 53.

One end of the conductor portion 93 (e.g., a rear end portion in the front-rear direction) is connected to the internal electrode 821 (e.g., an example of a first or second internal electrode) in the inner layer of the capacitor body 70, and the other end (e.g., a front end portion in the front-rear direction) is exposed on the front side surface of the capacitor body 70 (see, e.g., FIG. 3) to be connected to the external electrode 52. The conductor portion 93 is formed to protrude forwards from the front edge of the internal electrode 821. The conductor portion 93 is provided on only a part of the internal electrode 821 in the left-right direction, and is smaller than the internal electrode 821 in the width (the left-right width). The conductor portion 93 may be formed to be integrated with the internal electrode 821.

One end of the conductor portion 94 (e.g., a rear end portion in the front-rear direction) is connected to the internal electrode 823 (e.g., an example of a first or second internal electrode) in the inner layer of the capacitor body 70, and the other end (e.g., a front end portion in the front-rear direction) is exposed on the front side surface of the capacitor body 70 (see, e.g., FIG. 3) to be connected to the external electrode 52. The conductor portion 94 is formed to protrude forwards from the front edge of the internal electrode 823. The conductor portion 94 is provided on only a part of the internal electrode 823 in the left-right direction, and is smaller than the internal electrode 823 in the width (the left-right width). The conductor portion 94 is formed at a position which is offset with respect to the conductor portion 93. In the example illustrated in FIG. 2B, the conductor portion 94 is formed to be offset with respect to the conductor portion 93 in the left-right direction, specifically leftwards from the conductor portion 93. The conductor portion 94 may be formed to be integrated with the internal electrode 823.

In this manner, among the internal electrodes 821 to 824, the internal electrodes 821 and 823 are connected to the external electrode 52 through the conductor portions 93 and 94, respectively. Meanwhile, among the internal electrodes 821 to 824, the left end portion of each of the internal electrodes 822 and 824 is exposed on the left side surface of the capacitor body 70 (see, e.g., FIG. 3) to be connected to the external electrode 51.

In the example illustrated in FIG. 3, five capacitors at the front side and five capacitors at the rear side are formed (to have a parallel relationship). Thus, on the front side surface of the capacitor body 70, end portions of five conductor portions (including the conductor portions 93 and 94) are exposed to be offset in the left-right direction and the vertical direction. Similarly, on the rear side surface of the capacitor body 70, end portions of five conductor portions (including the conductor portions 91 and 92) are exposed to be offset in the left-right direction and the vertical direction.

Figure 5:
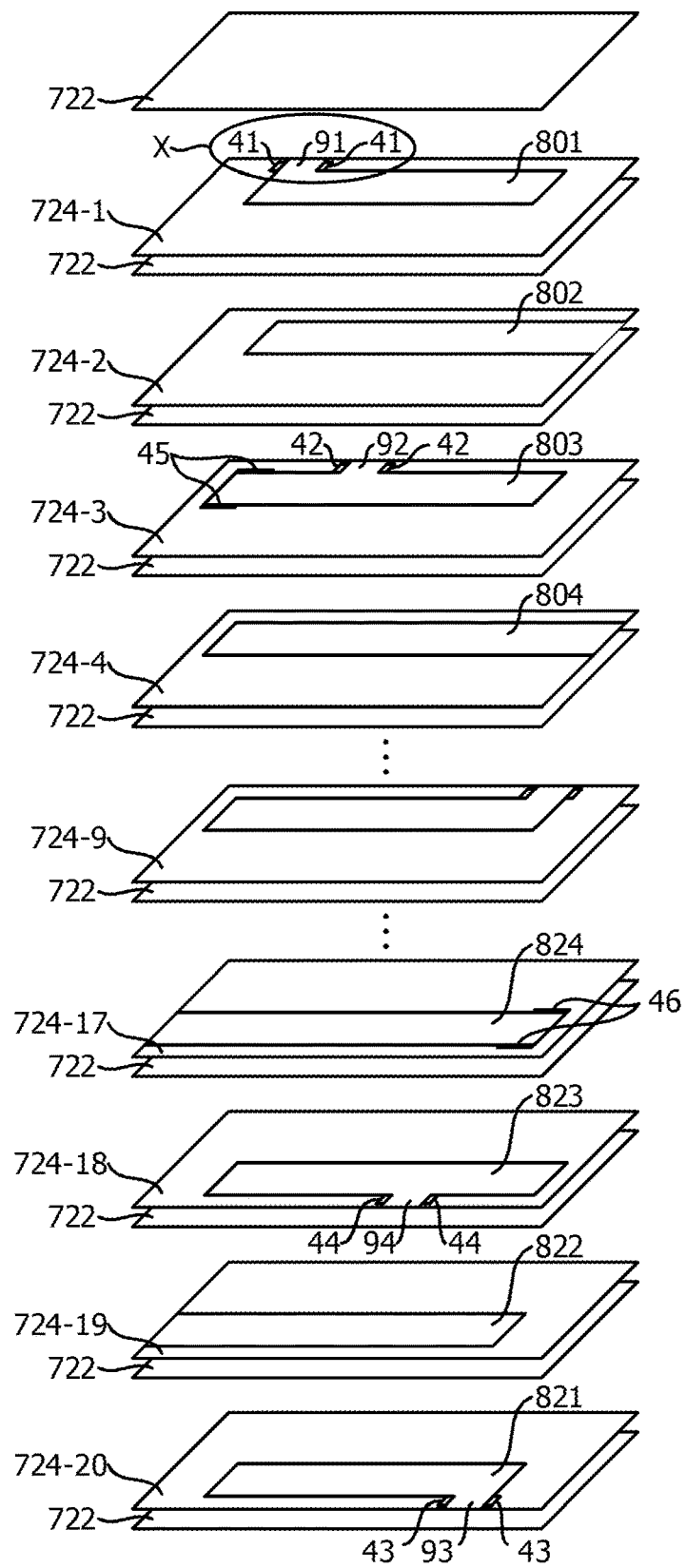
FIG. 5 is an exploded perspective view illustrating respective layers of the capacitor body according to the first embodiment.
Figure 6:
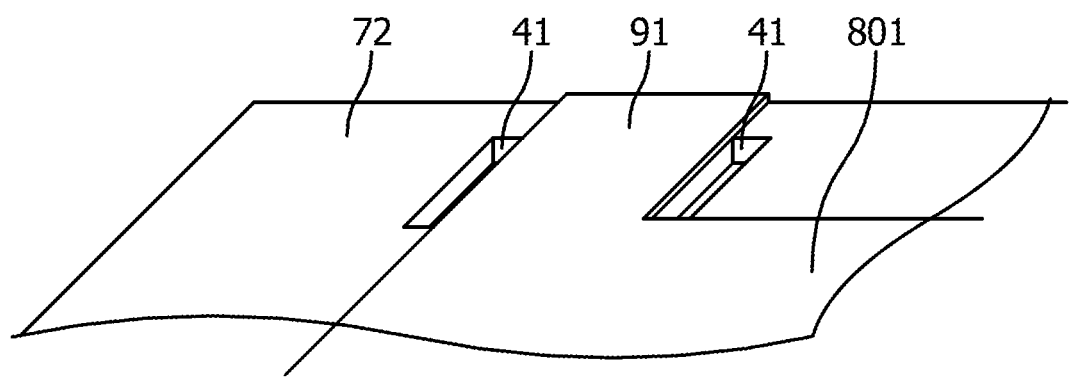
FIG. 6 is a view illustrating the X portion of FIG. 5 in an enlarged scale.

FIG. 5 is an explanatory view of a stacked structure of the capacitor body 70, and is an exploded perspective view illustrating respective layers of the capacitor body 70. In FIG. 5, as in the example illustrated in FIG. 3, the stacked structure in a case where five capacitors are formed at each of the front side and the rear side is illustrated. In FIG. 5, illustration of a part of layers is omitted. FIG. 6 is a view illustrating the X portion of FIG. 5 in an enlarged scale.

The capacitor body 70, as illustrated in FIG. 5, has a stacked structure in which a dielectric layer 722 formed by the dielectric 72 and an internal electrode layer formed with the internal electrode are alternately stacked. The internal electrode layers, as illustrated in FIG. 5, include internal electrode layers 724-1 to 724-20. In the internal electrode layer 724-1, the internal electrode 801 and the conductor portion 91 are formed, and in the internal electrode layer 724-2, the internal electrode 802 is formed. The dielectric layer 722 is sandwiched between the internal electrode layers 724-1 and 724-2. For example, the internal electrode 801 and the conductor portion 91 may be formed by printing a conductor on the dielectric layer. Similarly, for example, the internal electrode 802 may be formed by printing a conductor on the dielectric layer. In the same manner, other capacitors may be formed.

In an internal electrode layer 724-1, cavities 41 are formed at left and right sides of the conductor portion 91. The cavity 41 may be formed by removing a dielectric in the corresponding region. In this case, the depth of the cavity 41 corresponds to the thickness of the internal electrode layer 724-1. Similar cavities (e.g., cavities 42, 43, 44 and the like) may be formed in other conductor portions including the conductor portions 92 to 94. For example, in an internal electrode layer 724-3, cavities 42 are formed at left and right sides of the conductor portion 92. In an internal electrode layer 724-20, cavities 43 are formed at left and right sides of the conductor portion 93. In an internal electrode layer 724-18, cavities 44 are formed at left and right sides of the conductor portion 94. The technical significance of the cavities 41 to 44 will be described below.

In the internal electrode layer 724-3, cavities 45 are formed at front and rear sides of the left end portion of the internal electrode 803. Similarly, the cavity 45 may be formed by removing a dielectric in the corresponding region. The left end portion of the internal electrode 803 is a portion that may be transparently seen from the outside in the top view, as described above. Similar cavities 46 are also formed in the internal electrode 824. That is, in an internal electrode layer 724-17, cavities 46 are formed at front and rear sides of the right end portion of the internal electrode 824. The technical significance of the cavities 45 and 46 will be described below.

Figure 7B:
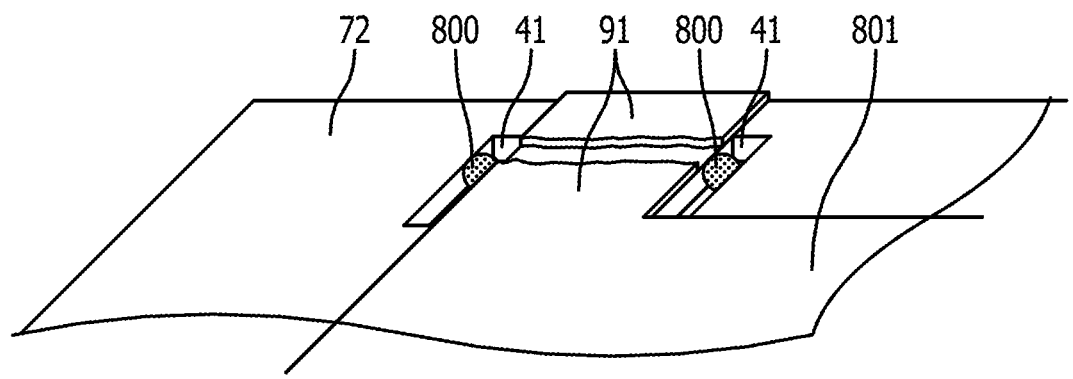
FIG. 7B is a view illustrating an example of a state of a cut conductor portion.

Next, referring to FIGS. 7A and 7B, descriptions will be made on a capacitance adjustment method of the crystal unit 100A.

FIG. 7A is a view illustrating an example of a mounting state of the crystal unit 100A. The crystal unit 100A, as illustrated in FIG. 7A, may be mounted on a board 8. In the example illustrated in FIG. 7A, a peripheral component 9 is mounted in the vicinity of the crystal unit 100A.

In a state where the crystal unit 100A is mounted on the board 8 as illustrated in FIG. 7A, a capacitance adjustment may be performed. The capacitance adjustment may be realized by applying a laser light to the upper side of the crystal unit 100A, thereby shaving at least one of a conductor portion such as the conductor portions 91 to 94, the left end portion of the internal electrode 803 and the right end portion of the internal electrode 824, as schematically indicated by the arrow L1 in FIG. 7A. The conductor portion such as the conductor portions 91 to 94, the left end portion of the internal electrode 803 and the right end portion of the internal electrode 824 are formed at positions transparently seen from the outside in the top view as described above, and may be easily applied with the laser light.

For example, a laser light may be applied to the conductor portion 91, thereby physically cutting the conductor portion 91 in the left-right direction (see, e.g., FIG. 7B) so that the internal electrode 801 and the external electrode 54 may be disconnected from each other. In this case, since the internal electrode 801 does not function as a capacitor, by that amount, the capacitance of the second capacitor 304 may be reduced. Similarly, a laser light may be applied to the conductor portion 93, thereby physically cutting the conductor portion 93 in the left-right direction so that the internal electrode 821 and the external electrode 52 may be disconnected from each other. In this case, since the internal electrode 821 does not function as a capacitor, by that amount, the capacitance of the first capacitor 302 may be reduced. In this manner, according to the first embodiment, only by physically cutting the conductor portion such as the conductor portions 91 to 94 in the left-right direction, the capacitance of the matching capacitor 300 of the crystal unit 100A may be reduced by a relatively large reduction amount (e.g., a reduction amount significantly larger than a physically cut range). This effect is advantageous when a capacitance to be adjusted (e.g., a capacitance to be reduced) is relatively large. Further, since the conductor portions 91 to 94 are formed at offset positions as described above, any of the conductor portions 91 to 94 may be physically cut, thereby increasing the degree of freedom of adjustment.

A laser light may be applied to the left end portion of the internal electrode 803 (e.g., an example of a third internal electrode), thereby shaving the left end portion of the internal electrode 803 in the front-rear direction so that an area of the internal electrode 803 (e.g., a facing area) may be reduced. In this case, the capacitance of the second capacitor 304 may be reduced by the amount of the reduced area of the internal electrode 803. Similarly, a laser light may be applied to the right end portion of the internal electrode 824 (e.g., an example of a third internal electrode), thereby shaving the right end portion of the internal electrode 824 in the front-rear direction so that an area of the internal electrode 824 (e.g., a facing area) may be reduced. In this case, the capacitance of the first capacitor 302 may be reduced by the amount of the reduced area of the internal electrode 824. In this manner, according to the first embodiment, the left end portion of the internal electrode 803 or the right end portion of the internal electrode 824 may be shaved by a laser light, thereby finely adjusting the capacitance of the matching capacitor 300 of the crystal unit 100A.

As described above, according to the first embodiment, after the crystal unit 100A is mounted, the capacitance of the matching capacitor 300 may be largely reduced or finely adjusted. Accordingly, even when an adjustment amount is relatively increased, the adjustment may be realized quickly with a high accuracy. For example, on the assumption that a capacitor has a size of 1.6 mm×0.8 mm and a capacitance of 10 pF, when the number of capacitors is 100, a capacitance per capacitor becomes 0.1 pF. A frequency variation rate varies according to an oscillation circuit. However, when it is assumed that the frequency variation rate is 10 ppm with respect to a capacitor capacitance of 1 pF, a frequency adjustment of 10 ppm may be carried out by physically cutting one of conductor portions such as the conductor portions 91 to 94. In the further fine adjustment, end portions of the internal electrodes 803 and 824 may be shaved so as to perform an adjustment to a desired frequency.

However, as described above, a vibration characteristic of the crystal unit 100A is generally varied under the influence of the capacitance of the pattern or the like on the board 8. Thus, even when the capacitance is adjusted at the time of manufacture of the crystal unit 100A as a single product, it is difficult to obtain a desired vibration characteristic of the crystal unit 100A after the crystal unit 100A is mounted.

In this respect, according to the first embodiment, as described above, the capacitance of the matching capacitor 300 may be largely reduced or finely adjusted after the crystal unit 100A is mounted. Thus, it becomes easy to obtain a desired vibration characteristic of the crystal unit 100A even after the crystal unit 100A is mounted. The vibration characteristic of the crystal unit 100A may be measured using a probe or the like. Accordingly, for example, a user may perform a capacitance adjustment as described above, while measuring the vibration characteristic of the crystal unit 100A using a probe or the like.

According to the first embodiment, cavities such as the cavities 41 to 44 are formed to be adjacent in the left-right direction to conductor portions such as the conductor portions 91 to 94. Thus, according to the first embodiment, products 800 (schematically illustrated in FIG. 7B) occurring when the conductor portion such as the conductor portions 91 to 94 is physically cut in the left-right direction by a laser light as described above may be accommodated in such cavities. The product 800 may be, for example, a conductive material, a gas or the like. Accordingly, as compared to a case where such a cavity is not formed, a stress in the portion physically cut by the laser light may be relieved.

Similarly, according to the first embodiment, cavities 45 are formed to be adjacent in the front-rear direction to the left end portion of the internal electrode 803. Thus, products occurring when the left end portion of the internal electrode 803 is shaved in the front-rear direction by a laser light as described above may be accommodated in such cavities 45. Accordingly, as compared to a case where the cavities 45 are not formed, a stress in the portion physically cut by the laser light may be relieved. This also applies to the cavities 46 in the right end portion of the internal electrode 824.

In the first embodiment described above, the cavities 41 are formed to be adjacent in the left-right direction to both sides of the conductor portion 91, but the cavity 41 may be formed at only one side of the conductor portion 91 in the left-right direction. This also applies to other cavities 42 to 44. In the first embodiment described above, similarly, the cavities 45 are formed to be adjacent in the front-rear direction to both sides of the left end portion of the internal electrode 803, but the cavity 45 may be formed at only one side of the left end portion of the internal electrode 803 in the front-rear direction. This also applies to other cavities 46.

In the first embodiment described above, internal electrodes extending outwards beyond other internal electrodes in the left-right direction, that is, internal electrodes having end portions for fine adjustment are the internal electrodes 803 and 824, but may be other internal electrodes. That is, the internal electrodes having end portions for fine adjustment may be any internal electrodes. In the first embodiment described above, the end portions for fine adjustment are left and right end portions, but instead of or in addition to this, front and rear end portions may be employed.

In the first embodiment described above, conductor portions such as the conductor portions 91 to 94 are provided in all pairs of internal electrodes, but may be provided in some of the pairs.

In the first embodiment described above, conductor portions such as the conductor portions 91 to 94 are provided in internal electrodes connected to the external electrode 52 and the external electrode 54. Instead, similar conductor portions may be provided in internal electrodes connected to the external electrode 51 and the external electrode 53. For example, instead of the conductor portion 91 formed on the internal electrode 801, a similar conductor portion may be formed on the internal electrode 802. In this case, the conductor portion formed on the internal electrode 802 has a smaller width than the front-rear width of the internal electrode 802, and is provided between the right end portion of the internal electrode 802 and the external electrode 53. In this case, the internal electrode 801 may be connected to the external electrode 54 over the entire width in the left-right direction.

Second Embodiment

Figure 8A:
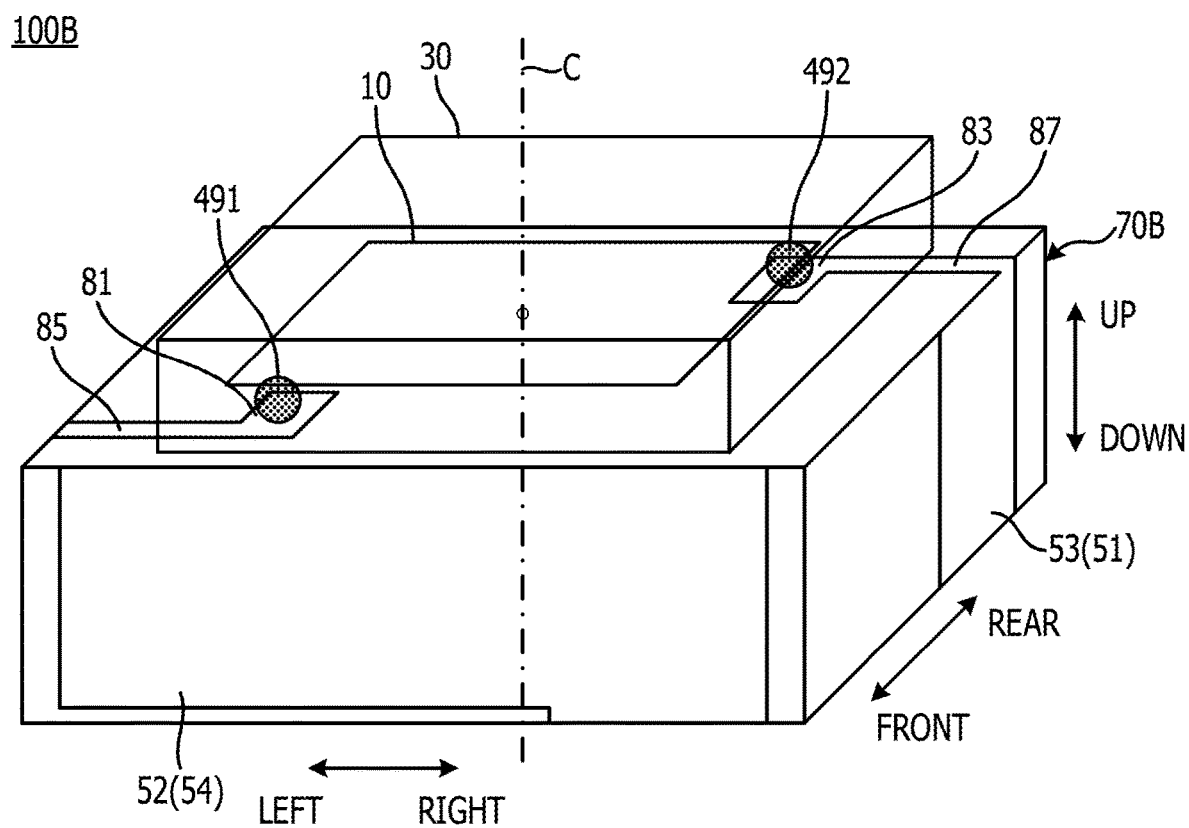
FIG. 8A is a perspective view schematically illustrating an external appearance of a crystal unit according to a second embodiment.
Figure 8B:
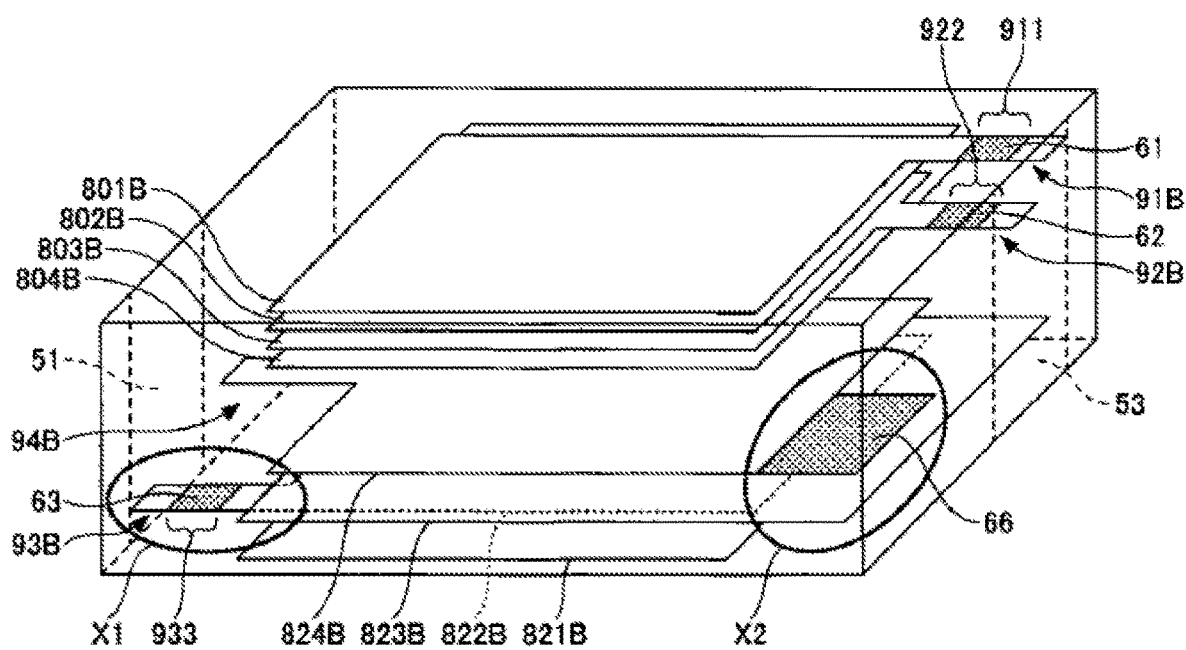
FIG. 8B is a perspective view schematically illustrating an internal electrode structure or the like of a capacitor body of the crystal unit illustrated in FIG. 8A.

FIG. 8A is a perspective view schematically illustrating an external appearance of a crystal unit 100B according to a second embodiment, and FIG. 8B is a perspective view schematically illustrating an internal electrode structure or the like of a capacitor body 70B of the crystal unit 100B illustrated in FIG. 8A. In FIG. 8A, the configuration within a casing 30 (e.g., a crystal piece 10 or the like) is transparently illustrated. In FIG. 8B, the internal electrode structure or the like of the crystal unit 100B is transparently illustrated.

The crystal unit 100B according to the second embodiment is different from the crystal unit 100 according to the first embodiment described above in that the capacitor body 70 is replaced by a capacitor body 70B, and conductor portions such as the conductor portions 91 to 94 are replaced by conductor portions such as conductor portions 91B to 93B. The crystal unit 100B according to the second embodiment is different from the crystal unit 100 according to the first embodiment described above in that coated conductor portions 61 to 63 and 66 are added. The crystal unit 100B according to the second embodiment is different from the crystal unit 100 according to the first embodiment described above in that cavities such as the cavities 41 to 44, 45, and 46 are eliminated, and cavities for placement of the coated conductor portions 61 to 63, and 66 are added. The capacitor body 70B is different from the capacitor body 70 according to the first embodiment described above in the internal electrode structure. In the descriptions and drawings of the second embodiment, some components that may be the same as those in the first embodiment described above are denoted by the same reference numerals and descriptions thereof will be omitted.

Here, in FIG. 8B, only a part of a plurality of internal electrodes is illustrated. In FIG. 8B, only two close to the top surface at the rear side, and only two close to the bottom surface at the front side are illustrated. Hereinafter, unless otherwise stated, descriptions will be made on the part of the internal electrodes illustrated in FIG. 8B.

The capacitor body 70B forms the matching capacitor 300 (see, e.g., FIG. 1) of the crystal unit 100B. The capacitor body 70B has a stacked structure including a light-transmitting dielectric 72 and internal electrodes 801B to 804B and 821B to 824B.

In the example illustrated in FIG. 8B, a plurality of internal electrodes 801B to 804B, and the portion of the dielectric 72 between the internal electrodes form the second capacitor 304. That is, the internal electrodes 801B and 802B are paired, and the internal electrodes 803B and 804B are paired so that a total of two capacitors are formed. The two capacitors are parallel to each other to form the second capacitor 304. Similarly, a plurality of internal electrodes 821B to 824B, and the portion of the dielectric 72 between the internal electrodes form the first capacitor 302. That is, the internal electrodes 821B and 822B are paired, and the internal electrodes 823B and 824B are paired so that a total of two capacitors are formed. The two capacitors are parallel to each other to form the first capacitor 302. Meanwhile, as described below, a part of the plurality of internal electrodes 801B to 804B, and 821B to 824B may be disconnected from the electrodes 81 and 83 (see, e.g., FIG. 1). In this case, a pair of internal electrodes including an internal electrode disconnected from the electrode 81 or 83 does not form the first capacitor 302 or the second capacitor 304.

In the example illustrated in FIG. 8B, the internal electrodes 801B to 804B and the internal electrodes 821B to 824B are formed to be stacked vertically. The internal electrodes 801B to 804B are substantially the same in the front-rear width, and are disposed at substantially the same position in the front-rear direction. The rear ends of the internal electrodes 802B and 804B are connected to the external electrode 54 over the entire width in the left-right direction. The internal electrodes 821B to 824B are substantially the same in the front-rear width, and are disposed at substantially the same position in the front-rear direction. The front ends of the internal electrodes 821B and 823B are connected to the external electrode 52 over the entire width in the left-right direction. Meanwhile, the number or arrangement of the internal electrodes is not limited thereto, but is optional.

In the example illustrated in FIG. 8B, according to a preferred embodiment, the internal electrode 823B extends rightwards beyond the right ends of other internal electrodes (e.g., the internal electrodes 801B to 804B, 821B, 822B, 824B or the like) in the left-right direction. This technical significance will be described below.

The conductor portions 91B to 93B are formed in the inner layer of the capacitor body 70B.

One end of the conductor portion 91B (e.g., a left end portion in the left-right direction) is connected to the internal electrode 801B (e.g., an example of a first internal electrode) in the inner layer of the capacitor body 70B, and the other end (a right end portion in the left-right direction) is exposed on the right side surface of the capacitor body 70B to be connected to the external electrode 53. The conductor portion 91B is formed to protrude rightwards from the right edge of the internal electrode 801B. The conductor portion 91B is provided on only a part of the internal electrode 801B in the front-rear direction, and is smaller than the internal electrode 801B in the width (the front-rear width). The conductor portion 91B may be formed to be integrated with the internal electrode 801B.

A disconnecting portion 911 is formed between both ends of the conductor portion 91B in the left-right direction. The disconnecting portion 911 is formed over a predetermined length in the left-right direction. The disconnecting portion 911 may be formed by not printing, for example, a conductor in a corresponding region. The disconnecting portion 911 is formed at a region (position) transparently seen from the outside of the capacitor body 70B in the top view. This technical significance will be described below.

One end of the conductor portion 92B (e.g., a left end portion in the left-right direction) is connected to the internal electrode 803B (e.g., an example of a first internal electrode) in the inner layer of the capacitor body 70B, and the other end (e.g., a right end portion in the left-right direction) is exposed on the right side surface of the capacitor body 70B to be connected to the external electrode 53. The conductor portion 92B is formed to protrude rightwards from the right edge of the internal electrode 803B. The conductor portion 92B is provided on only a part of the internal electrode 803B in the front-rear direction, and is smaller than the internal electrode 803B in the width (the front-rear width). The conductor portion 92B may be formed to be integrated with the internal electrode 803B.

A disconnecting portion 922 is formed between both ends of the conductor portion 92B in the left-right direction. The disconnecting portion 922 is formed over a predetermined length in the left-right direction. The disconnecting portion 922 may be formed by not printing, for example, a conductor in a corresponding region. The disconnecting portion 922 is formed at a region (position) transparently seen from the outside of the capacitor body 70B in the top view. Specifically, the disconnecting portion 922 is formed at a position which is offset with respect to the disconnecting portion 911. In the example illustrated in FIG. 8B, the disconnecting portion 922 is formed to be offset with respect to the disconnecting portion 911 in the front-rear direction, specifically forwards from the disconnecting portion 911. This technical significance will be described below.

One end of the conductor portion 93B (e.g., a right end portion in the left-right direction) is connected to the internal electrode 822B (e.g., an example of a first internal electrode) in the inner layer of the capacitor body 70B, and the other end (e.g., a left end portion in the left-right direction) is exposed on the left side surface of the capacitor body 70B to be connected to the external electrode 51. The conductor portion 93B is formed to protrude leftwards from the left edge of the internal electrode 822B. The conductor portion 93B is provided on only a part of the internal electrode 822B in the front-rear direction, and is smaller than the internal electrode 822B in the width (the front-rear width). The conductor portion 93B may be formed to be integrated with the internal electrode 822B.

A disconnecting portion 933 is formed between both ends of the conductor portion 93B in the left-right direction. The disconnecting portion 933 is formed over a predetermined length in the left-right direction. The disconnecting portion 933 may be formed by not printing, for example, a conductor in a corresponding region. The disconnecting portion 933 is formed at a region (position) transparently seen from the outside of the capacitor body 70B in the top view. This technical significance will be described below.

The coated conductor portions 61 to 63 and 66 include conductors coated with an insulating material, respectively. The coated conductor portions 61 to 63 and 66 are formed of, for example, a material that is melted by a laser light. Meanwhile, the coating is preferably formed of a heat-resistant material that may withstand the heat during baking of a capacitor. Each of the coated conductor portions 61 to 63 and 66 may be, for example, a spherical member that encloses a metal material as an insulator (see, e.g., FIGS. 9 and 10), or a sheet-like member that encloses a metal material as an insulator, and its shape or the like is optional.

Figure 9:
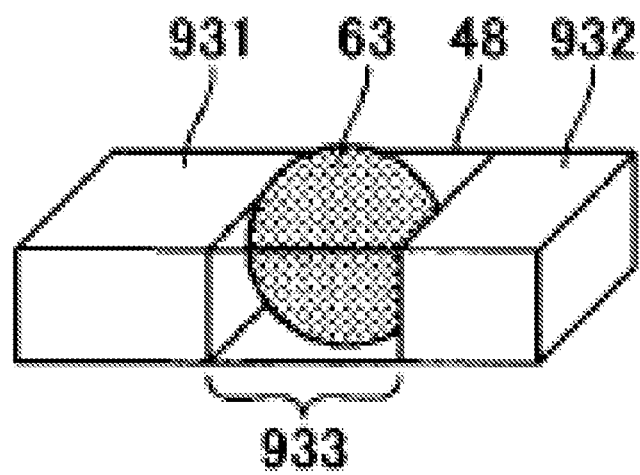
FIG. 9 is a view illustrating the X1 portion of FIG. 8B in an enlarged scale.

The coated conductor portion 61 is provided in the disconnecting portion 911. The coated conductor portion 61 in a coated state is electrically insulated from the conductor portion 91B. The coated conductor portion 62 is provided in the disconnecting portion 922. The coated conductor portion 62 in a coated state is electrically insulated from the conductor portion 92B. The coated conductor portion 63 is provided in the disconnecting portion 933. The coated conductor portion 63 in a coated state is electrically insulated from the conductor portion 93B. The coated conductor portion 63, for example, as illustrated in FIG. 9, may be accommodated within a cavity 48 formed in the disconnecting portion 933. The cavity 48 may be formed by removing the dielectric in the corresponding region (e.g., a dielectric for one layer). Other coated conductor portions 61 and 62 may also be similarly accommodated within cavities.

The coated conductor portion 66 is provided to be adjacent to an end portion of the internal electrode 824B (e.g., an example of a first internal electrode). In the example illustrated in FIG. 8B, the coated conductor portion 66 is provided to be adjacent to a right end portion of the internal electrode 824B. Also, the coated conductor portion 66 in a coated state is electrically insulated from the internal electrode 824B. The coated conductor portion 66 vertically faces the right end portion of the internal electrode 823B. The right end portion of the internal electrode 823B, as described above, extends rightwards beyond the right ends of other internal electrodes. Accordingly, the coated conductor portion 66 facing the right end of the internal electrode 823B may be transparently seen from the outside of the capacitor body 70B in the top view.

The coated conductor portion 66 may be provided in any range in which the coated conductor portion 66 may vertically face the right end portion of the internal electrode 823B. Meanwhile, the coated conductor portion 66 is preferably provided in a region where the coated conductor portion 66 does not overlap other internal electrodes and the conductor portions 91B and 92B in the top view. The range (area) where the coated conductor portion 66 is provided corresponds to the range (area) for a capacitance adjustment (increase) to be described below.

Figure 10:
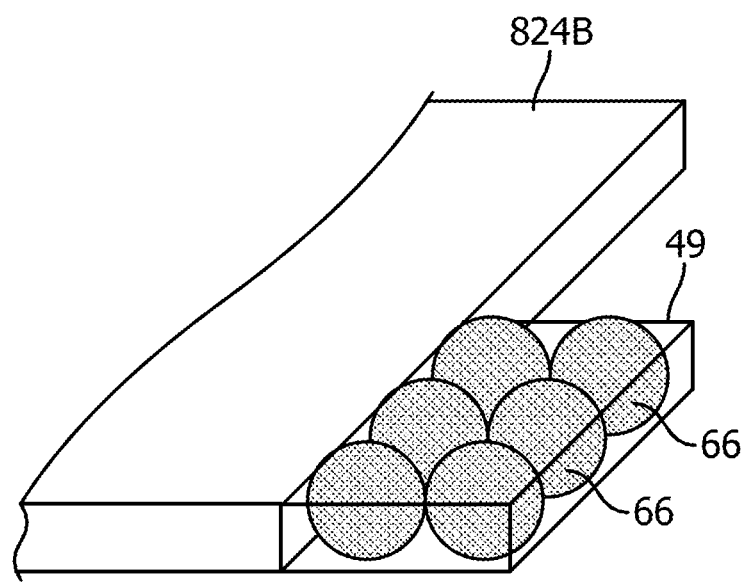
FIG. 10 is a view illustrating the X2 portion of FIG. 8B in an enlarged scale.

For example, the coated conductor portion 66, as illustrated in FIG. 10, may be accommodated within a cavity 49 formed to be adjacent to the end portion of the internal electrode 824B. In FIG. 10, the illustration of a portion of the dielectric 72 around the cavity 49 is omitted. In the example illustrated in FIG. 10, a plurality of coated conductor portions 66 are accommodated within the cavity 49. In this case, the number of coated conductor portions 66 whose coating is to be melted by a laser light may be increased in a stepwise manner, thereby performing the capacitance adjustment (increase) to be described below in a stepwise manner.

Figure 11:
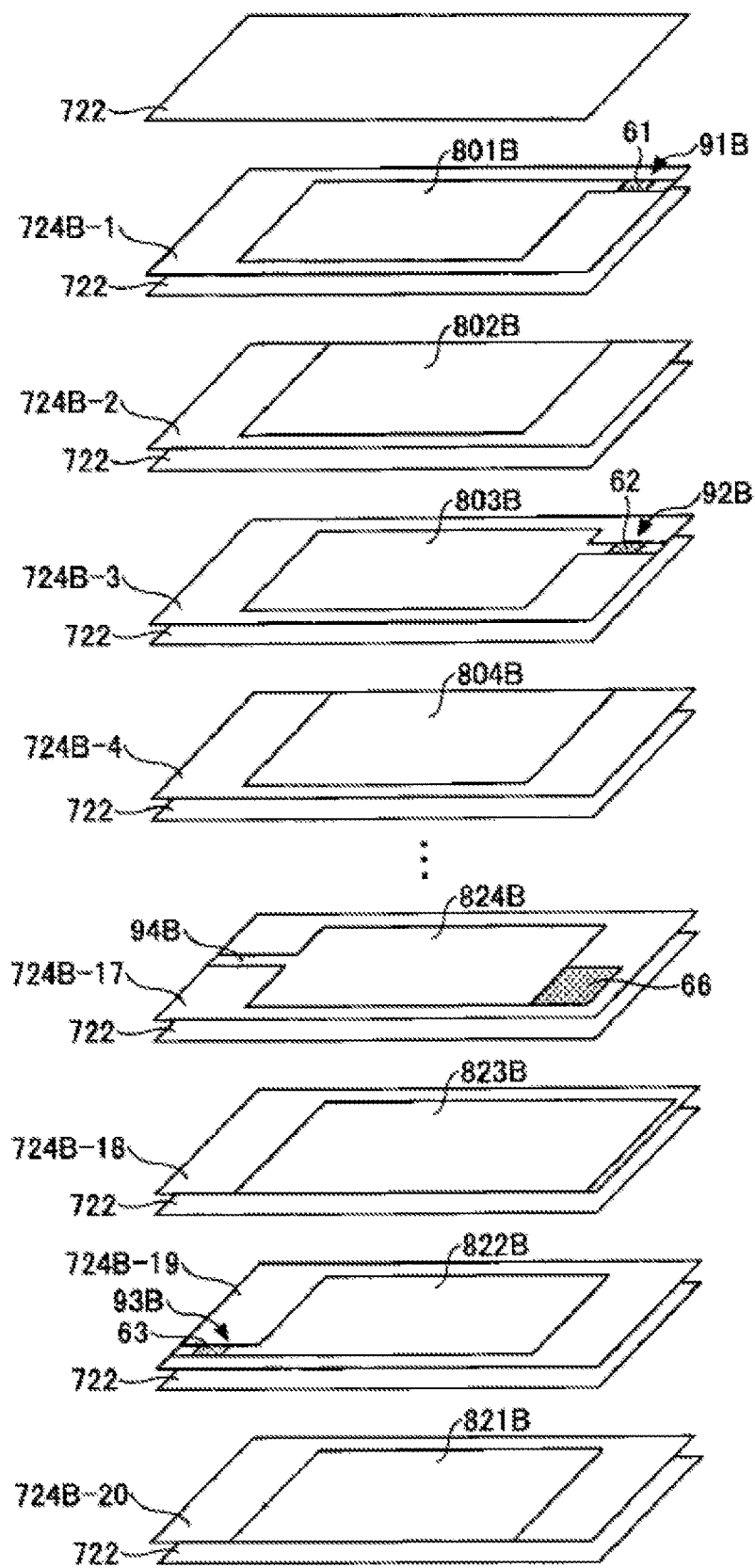
FIG. 11 is an exploded perspective view illustrating respective layers of the capacitor body according to the second embodiment.

FIG. 11 is an explanatory view of a stacked structure of the capacitor body 70B, and is an exploded perspective view illustrating respective layers of the capacitor body 70B. Here, an internal electrode structure in which five capacitors for each of the first capacitor 302 and the second capacitor 304 may be formed is assumed. Meanwhile, in FIG. 11, as in the example illustrated in FIG. 10, only the internal electrodes 801B to 804B related to two capacitors close to the top surface and the internal electrodes 821B to 824B related to two capacitors close to the bottom surface are illustrated.

The capacitor body 70B, as illustrated in FIG. 11, has a stacked structure in which a dielectric layer 722 formed by only the dielectric 72 and a layer formed with the internal electrode are alternately stacked. The layer formed with the internal electrode includes, as illustrated in FIG. 11, internal electrode layers 724B-1 to 724B-20. In the internal electrode layer 724B-1, the internal electrode 801B and the conductor portion 91B are formed, and the coated conductor portion 61 is provided. In the internal electrode layer 724B-2, the internal electrode 802B is formed. Between the internal electrode layer 724B-1 and the internal electrode layer 724B-2, the dielectric layer 722 is interposed. In this manner, a capacitor related to the internal electrode 801B is formed. In the same manner, the capacitor related to the internal electrode 803B is formed.

In the internal electrode layer 724B-17, the internal electrode 824B is formed. In the internal electrode layer 724B-17, the coated conductor portion 66 is provided to be adjacent to the right end of the internal electrode 824B. In the internal electrode layer 724B-17, the internal electrode 824B and the conductor portion 94B are formed. In the example illustrated in FIG. 11, in the conductor portion 94B, a disconnecting portion such as the disconnecting portion 933 is not formed, and a coated conductor portion such as the coated conductor portion 63 is not provided. Meanwhile, in the conductor portion 94B, a disconnecting portion such as the disconnecting portion 933 may be formed, and a coated conductor portion such as the coated conductor portion 63 may be provided. Between the internal electrode layer 724B-17 and the internal electrode layer 724B-18, the dielectric layer 722 is interposed. In this manner, the capacitor related to the internal electrode 824B is formed.

In the internal electrode layer 724B-19, the internal electrode 822B and the conductor portion 93B are formed, and the coated conductor portion 63 is provided. In the internal electrode layer 724B-20, the internal electrode 821B is formed. Between the internal electrode layer 724B-19 and the internal electrode layer 724B-20, the dielectric layer 722 is interposed. In this manner, the capacitor related to the internal electrode 822B is formed.

According to the second embodiment, like in the first embodiment described above, in a state where the crystal unit 100B is mounted on the board 8 (see, e.g., FIG. 7A), the capacitance adjustment may be performed. The capacitance adjustment may be realized by applying a laser light to the upper side of the crystal unit 100B, thereby melting at least one of the coated conductor portions 61 to 63 and 66. The coated conductor portions 61 to 63 and 66, as described above, are provided at positions transparently seen from the outside in the top view, and may be easily applied with the laser light.

For example, a laser light may be applied to the coated conductor portion 61, thereby melting the coated conductor portion 61 so that the internal electrode 801B is connected to the external electrode 53. That is, when the coated conductor portion 61 is melted, the conductor within the coated conductor portion 61 is metallically bonded to both side patterns of the disconnecting portion 911 in the conductor portion 91B. Thus, an electrical disconnection in the disconnecting portion 911 of the conductor portion 91B is eliminated. As a result, the internal electrode 801B is connected to the external electrode 53, and the internal electrode 801B serves as a capacitor, and thus, by that amount, the capacitance of the second capacitor 304 may be increased. Likewise, a laser light may be applied to the coated conductor portion 62, thereby melting the coated conductor portion 62 so that the internal electrode 803B is connected to the external electrode 53. In this case, since the internal electrode 803B functions as a capacitor, by that amount, the capacitance of the second capacitor 304 may be increased. In this manner, according to the second embodiment, only by melting the coated conductor portions 61 to 63, the capacitance of the matching capacitor 300 of the crystal unit 100B may be increased by a relatively large increase amount. This effect is advantageous when a capacitance to be adjusted (e.g., a capacitance to be increased) is relatively large.

A laser light may be applied to the coated conductor portion 66 adjacent to the internal electrode 824B, thereby melting the coated conductor portion 66 so that the effective area of the internal electrode 824B (e.g., the area facing the internal electrode 823B) may be increased. That is, when the coated conductor portion 66 is melted, the conductor within the coated conductor portion 66 is metallically bonded to the pattern in the right end portion of the internal electrode 824B, and the right end portion of the internal electrode 824B extends rightwards. As a result, the capacitance of the first capacitor 302 may be increased by the amount of the increased area of the internal electrode 824B. In this manner, according to the second embodiment, by melting the coated conductor portion 66, the capacitance of the matching capacitor 300 of the crystal unit 100B may be finely adjusted.

As described above, according to the second embodiment, after the crystal unit 100B is mounted, the capacitance of the matching capacitor 300 may be largely increased or finely adjusted. Accordingly, even when an adjustment amount is relatively increased, the adjustment may be realized quickly with a high accuracy. For example, on the assumption that a capacitor has a size of 1.6 mm×0.8 mm and a capacitance of 10 pF, one spherical coated conductor portion 66 is set to have a diameter size of about 50 um. When the coated conductor portions 66 are aligned at a short side (e.g., about 0.3 mm) of the internal electrode of the capacitor, six coated conductor portions 66 may be aligned in one row. The capacitance per one is about 0.002 pF, and the capacitance of two rows becomes about 0.024 pF, that is, about ¼ of one layer. In order to largely increase the capacitance, the coated conductor portions 61 to 63 may be melted to be connected to the internal electrodes 801B, 803B, and 822B, and in order to perform fine adjustment, the coated conductor portions 66 may be melted one by one to be connected to the internal electrode 824B.

In the second embodiment, the coated conductor portion 66 or the extension of the right end portion of the internal electrode 824B may be omitted. In this case, the fine adjustment through melting of the coated conductor portion 66 becomes impossible, but the large increase of the capacitance through the melting of the coated conductor portions 61 to 63 is still possible.

In the second embodiment, the disconnecting portions 911, 922, and 933 and the coated conductor portions 61 to 63 may be omitted. That is, the conductor portions 91B, 92B, and 93B may be formed as in the conductor portion 94B, or may be connected to the external electrode 51 or 53 over the whole front-rear width of the internal electrodes 801B, 803B, and 822B. In this case, the large increase of a capacitance through melting of the coated conductor portions 61 to 63 becomes impossible, but the fine adjustment through the melting of the coated conductor portion 66 is still possible.

In the second embodiment, the coated conductor portion 66 is provided adjacent to the right end of the internal electrode 824B, but may be provided adjacent to another end portion of the internal electrode 824B. In this manner, the coated conductor portion 66 may be provided at any position as long as at the position, the coated conductor portion 66 may be transparently seen in the top view and connected to the internal electrode 824B during melting using a laser light.

In the second embodiment, the coated conductor portion 66 is provided adjacent to the internal electrode 824B, as an internal electrode for fine adjustment, but may be provided adjacent to another internal electrode. That is, a coated conductor portion such as the coated conductor portion 66 may be provided adjacent to any internal electrode. For example, the coated conductor portion such as the coated conductor portion 66 may be provided adjacent to an internal electrode related to each of the first capacitor 302 and the second capacitor 304.

In the second embodiment, the internal electrodes in which the conductor portions 91B, 92B, and 93B and the coated conductor portions 61 to 63 are provided are the internal electrodes 801B, 803B, and 822B, but may be other internal electrodes. That is, the internal electrodes in which conductor portions such as the conductor portions 91B, 92B, and 93B, and coated conductor portions such as the coated conductor portions 61 to 63 are provided may be any internal electrodes. The number of the internal electrodes in which the conductor portions 91B, 92B, and 93B and the coated conductor portions 61 to 63 are provided may be other than three.

The second embodiment may be combined with the first embodiment described above. For example, the conductor portion 94B illustrated in FIGS. 8B and 11 may function as a conductor portion that may be physically cut by being applied with a laser light as in the conductor portion 91 or the like according to the first embodiment described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A crystal unit comprising:
   a capacitor body in which a plurality of light-transmitting dielectrics and a plurality of internal electrodes are alternately stacked;
   a crystal piece arranged above the capacitor body and having excitation electrodes on both surfaces thereof;
   an external electrode formed on a surface of the capacitor body; and
   a first conductor portion formed in an inner layer of the capacitor body, and including one end electrically coupled to a first internal electrode among the plurality of internal electrodes, and the other end electrically coupled to the external electrode,
   a fourth internal electrode among the plurality of internal electrodes includes one end portion that is exposed on the surface of the capacitor body and is electrically coupled to the external electrode.

2. The crystal unit according to claim 1, wherein the first conductor portion has a smaller width than a minimum width of the first internal electrode.

3. The crystal unit according to claim 1, wherein the first conductor portion is electrically disconnected between the one end and the other end.

4. The crystal unit according to claim 3, further comprising: a cavity formed in the inner layer of the capacitor body to be adjacent to the first conductor portion.

5. The crystal unit according to claim 1, further comprising:
   a second conductor portion formed in the inner layer of the capacitor body, and including one end electrically coupled to a second internal electrode among the plurality of internal electrodes, and the other end electrically coupled to the external electrode,
   wherein the first conductor portion and the second conductor portion are formed at positions which are offset with respect to each other in a plan view seen in a stacking direction of the capacitor body.

6. The crystal unit according to claim 5, wherein at least one of the first conductor portion and the second conductor portion is electrically disconnected between the one end and the other end.

7. The crystal unit according to claim 1, wherein a third internal electrode among the plurality of internal electrodes is larger than the first internal electrode in area.

8. The crystal unit according to claim 7, further comprising a cavity formed in the inner layer of the capacitor body to be adjacent to an end portion of the third internal electrode.

9. The crystal unit according to claim 1, wherein the first conductor portion is formed in a region transparently seen from outside of the capacitor body.

10. The crystal unit according to claim 1, wherein the dielectrics are formed of a transparent or semi-transparent ceramic material.

11. A crystal unit comprising:
    a capacitor body in which a plurality of light-transmitting dielectrics and a plurality of internal electrodes are alternately stacked;
    a crystal piece arranged above the capacitor body and having excitation electrodes on both surfaces thereof;
    an external electrode formed on a surface of the capacitor body;
    a first conductor portion formed in an inner layer of the capacitor body, and including one end electrically coupled to a first internal electrode among the plurality of internal electrodes, the other end electrically coupled to the external electrode, and a disconnecting portion formed between the one end and the other end; and
    a coated conductor portion formed in the disconnecting portion and including a conductor coated with an insulating material.

12. The crystal unit according to claim 11, wherein the disconnecting portion is formed in a region transparently seen from outside of the capacitor body.

13. The crystal unit according to claim 11, wherein the coated conductor portion is formed in a cavity in the inner layer of the capacitor body.

14. The crystal unit according to claim 13, wherein the cavity is formed in a region transparently seen from outside of the capacitor body.

* * * * *